United States Patent [19]
Grabbe et al.

[11] Patent Number: 5,342,206
[45] Date of Patent: Aug. 30, 1994

[54] SOCKET FOR DIRECT ELECTRICAL CONNECTION TO AN INTEGRATED CIRCUIT CHIP

[75] Inventors: Dimitry G. Grabbe, Middletown; Iosif Korsunsky, Harrisburg, both of Pa.

[73] Assignee: The Whitaker Corporation, Wilmington, Del.

[21] Appl. No.: 92,149

[22] Filed: Jul. 15, 1993

[51] Int. Cl.⁵ ............................................. H01R 23/68
[52] U.S. Cl. ...................................... 439/71; 439/331; 439/381
[58] Field of Search ............... 439/71, 525, 526, 330, 439/331, 381; 324/158 F, 158 P

[56] References Cited

U.S. PATENT DOCUMENTS

| | | | |
|---|---|---|---|
| 4,018,494 | 4/1977 | Scheingold et al. | 439/330 |
| 4,609,243 | 9/1986 | Wyss | 439/381 |
| 4,713,022 | 12/1987 | Pfaff | 439/526 |
| 5,057,904 | 10/1991 | Nagato et al. | 439/71 |
| 5,068,601 | 11/1991 | Parmenter | 439/331 |
| 5,106,309 | 4/1992 | Matsuoka et al. | 439/526 |
| 5,117,330 | 5/1992 | Miazga | 439/330 |
| 5,247,250 | 9/1993 | Rios | 439/70 |

*Primary Examiner*—Gary F. Paumen
*Attorney, Agent, or Firm*—Driscol A. Nina; Bruce J. Wolstoncroft

[57] ABSTRACT

The present invention is a socket for removably connecting electrical conductors directly to the bond pads of an integrated circuit chip, and includes a chip holder that locks into the socket for burn-in and other testing and then can be removed and easily handled by automated equipment in the further processing of the chip. The socket has a series of contacts that are guided into electrical engagement with the bond pads through precisely positioned openings in a ceramic plate. The ceramic plate and the chip holder are aligned by a pair of guide pins that project from a housing. A pair of latching members secure the chip holder to the housing during burn-in and testing.

20 Claims, 6 Drawing Sheets

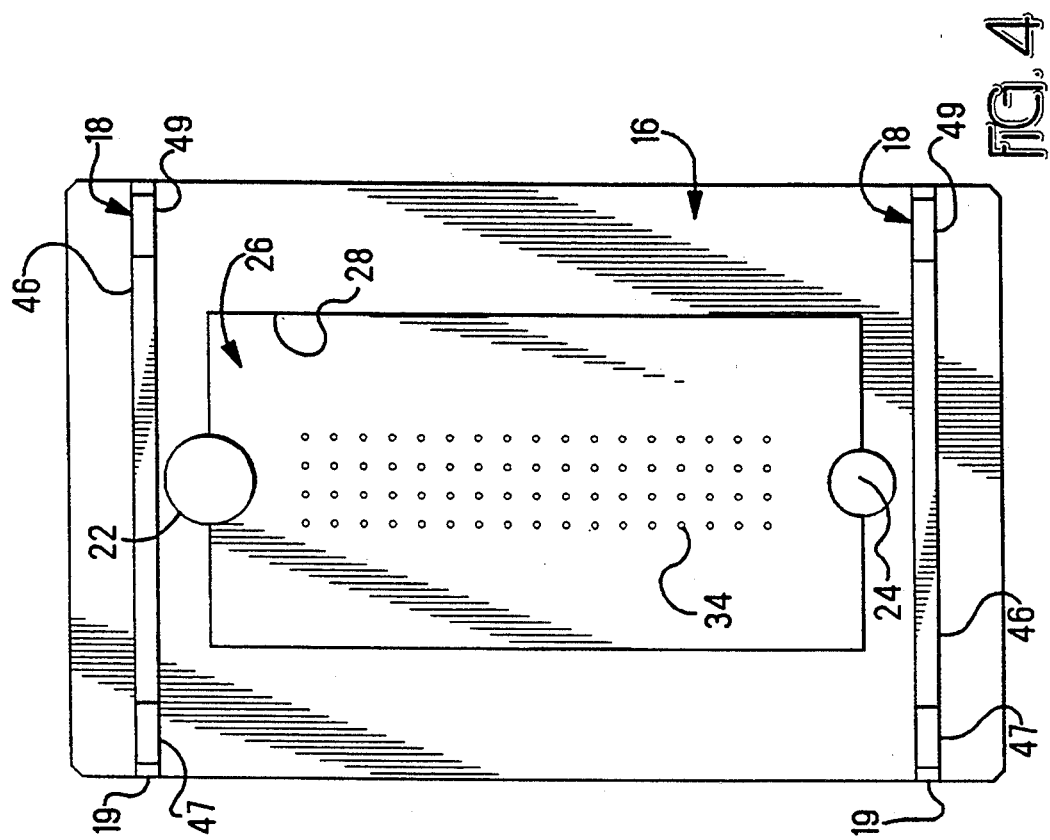
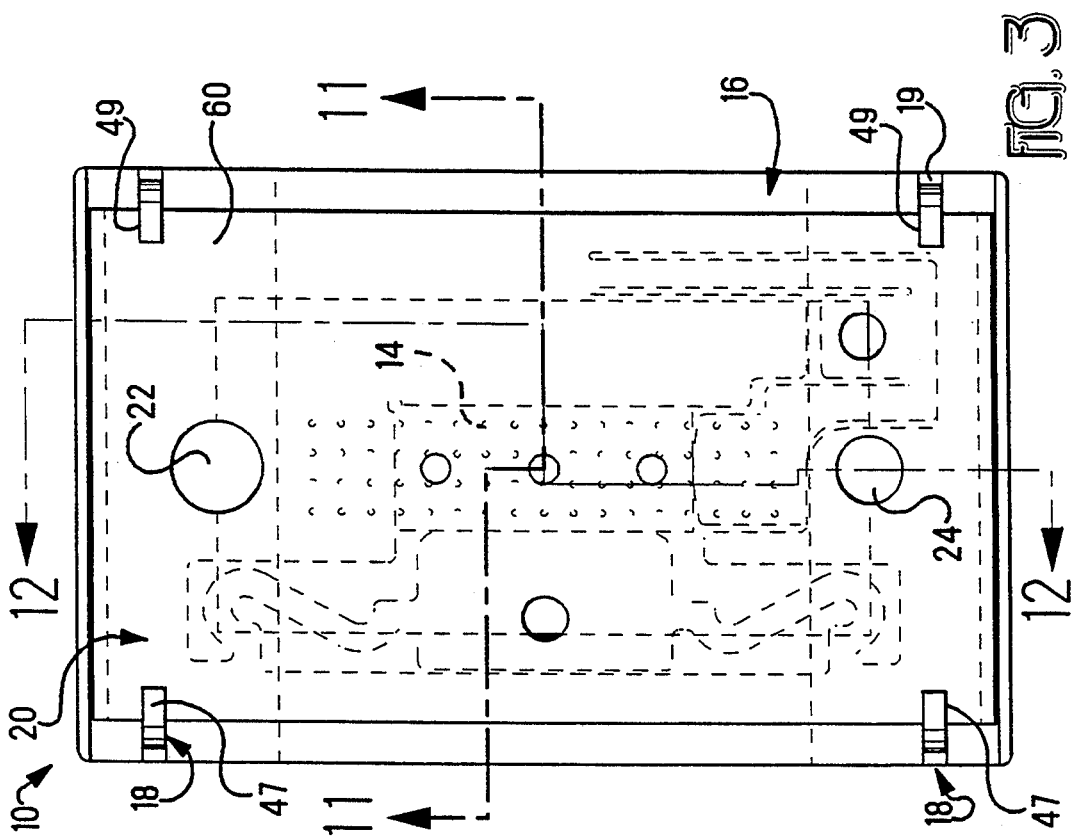

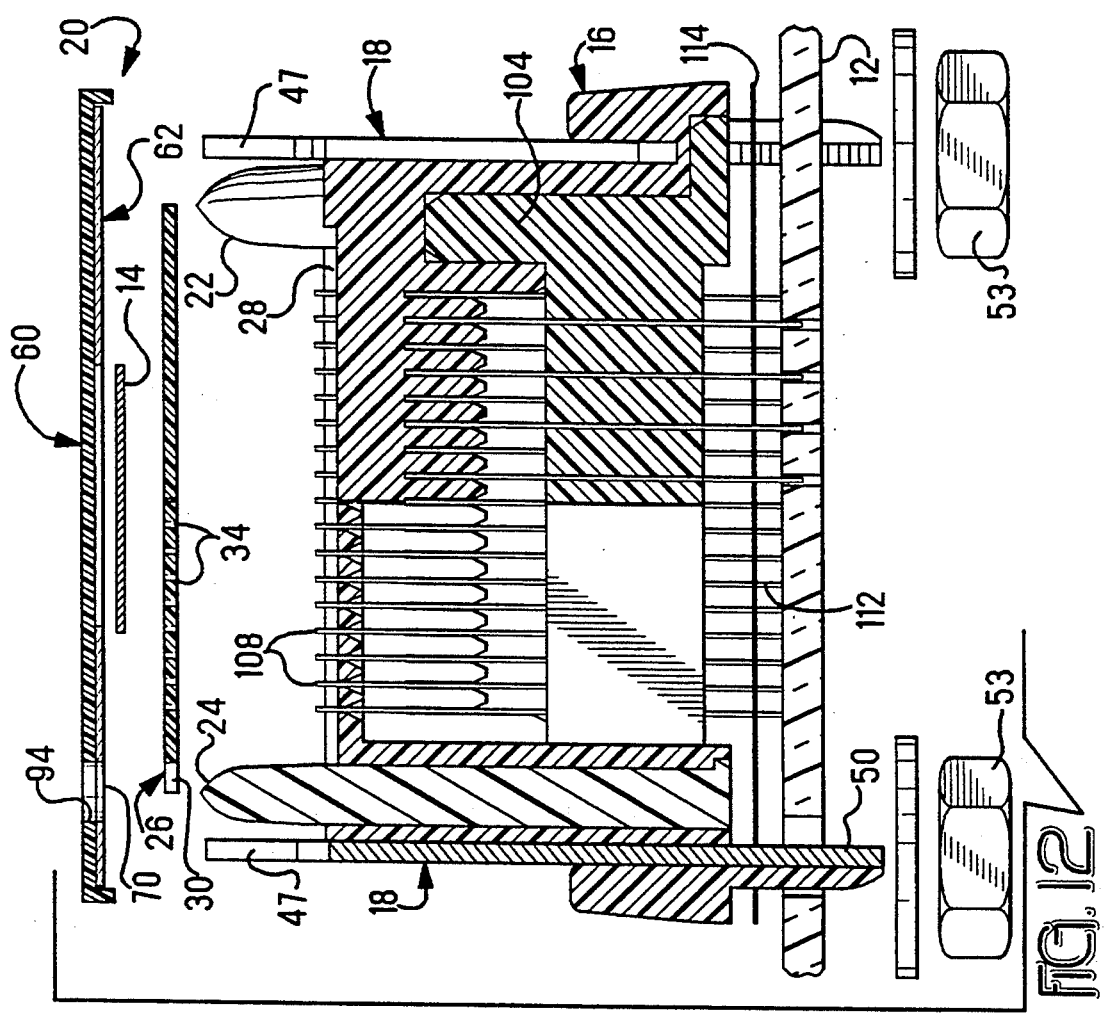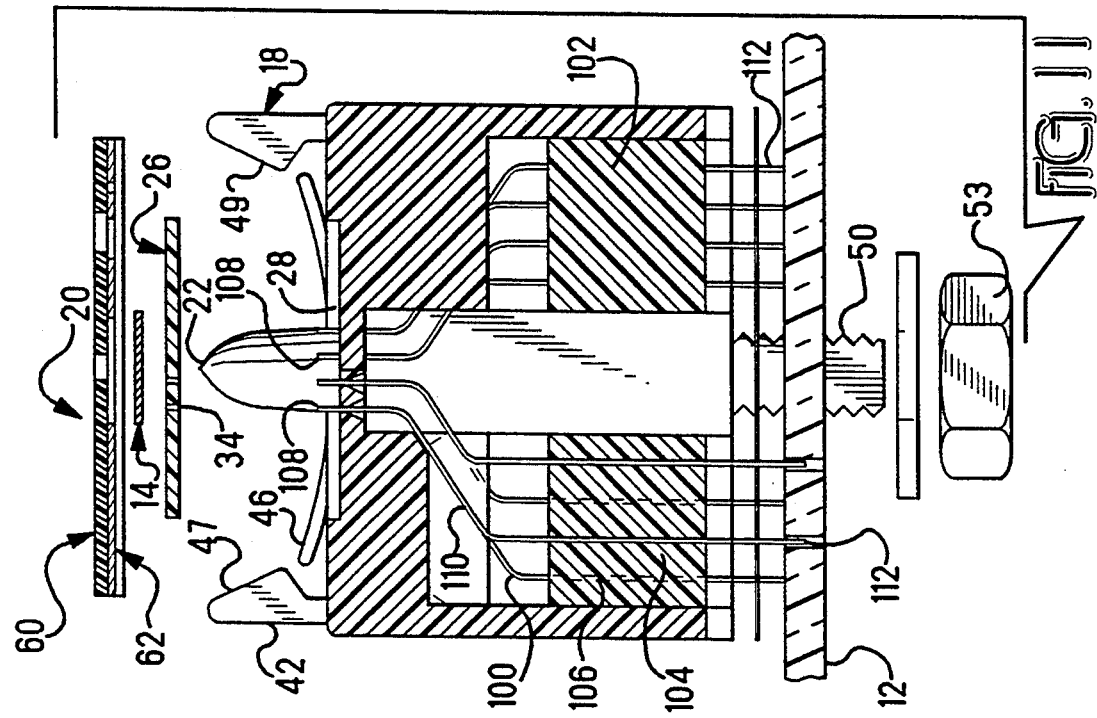

SOCKET FOR DIRECT ELECTRICAL CONNECTION TO AN INTEGRATED CIRCUIT CHIP

The present invention is related to a socket for removably connecting electrical conductors directly to the bond pads of an integrated circuit chip.

BACKGROUND OF THE INVENTION

In the manufacture of integrated circuit devices a large number of identical circuits are formed simultaneously on a single wafer. The wafer is then saw-cut into individual chips, or dies, which must then be handled individually during further stages of manufacturing as they are utilized in products. Because of the high cost of packaging the chip and installing it in the final product, it is important that each chip be defect free. Therefore, there is a strong incentive to identify and discard defective chips early. Typically, the chips are attached to a burn-in fixture and electrically exercised for several hours, frequently between 40 and 90 hours, to detect failures. Failures, if they occur, usually do so within this burn-in period. After successfully completing burn-in, the chip is considered by the industry to be a "known good die". Such burn-in procedures, utilizing presently available equipment, are very expensive and subsequent handling of the chip frequently results in errors of alignment or even damage to the chip. What is needed is an economical and easily used socket that will directly connect to the bond pads of the chip for burn-in and other testing, that later can be easily and safely removed. The chip should be in a carrier that is conveniently compatible with the socket and with standard automation practices and equipment.

SUMMARY OF THE INVENTION

A socket is disclosed for electrically connecting to and disconnecting from the bond pads of an integrated circuit chip. The bond pads of the chip are spaced in a specific pattern. The socket includes a chip holder for holding the chip in a desired position; a housing; and contact members in the housing. One end of each of the contact having a contact tip adapted for electrically contacting a respective bond pad of the chip. A guide plate is associated with the housing for positioning the contact tips to correspond with the specific pattern of the bond pads. Means for aligning the guide plate and the chip holder is provided so that the contact tips are in registry with the bond pads. A latching member is included for releasably securing the chip holder to the housing so that each contact tip electrically contacts its respective bond pad.

DESCRIPTION OF THE FIGURES

FIG. 3 is a top view of the socket shown in FIG. 1;

FIG. 4 is a view similar to that of FIG. 3 with the chip carrier removed;

FIG. 11 is a cross-sectional view taken along the lines 11—11 shown in FIG. 3;

FIG. 12 is a cross-sectional view taken along the lines 12—12 shown in FIG. 3.

DESCRIPTION OF THE PREFERRED EMBODIMENT

Figure 1:
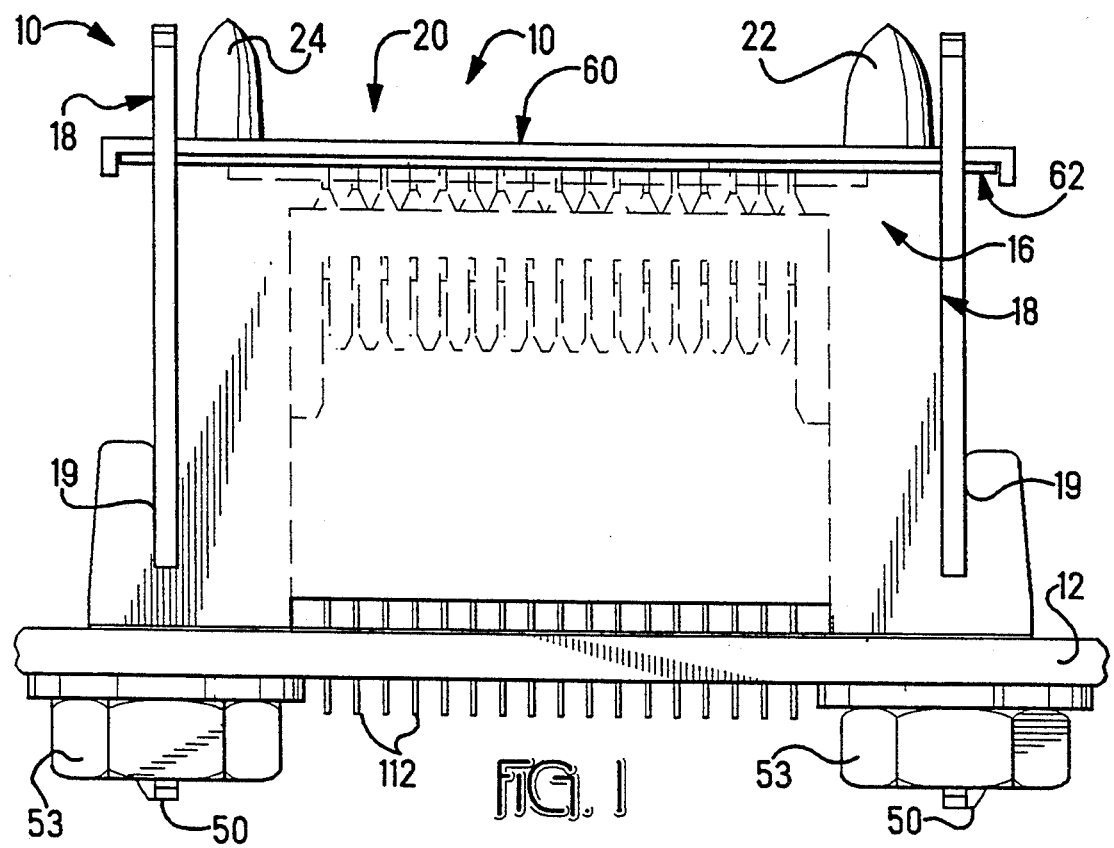
FIG. 1 is a front view of a socket incorporating the teachings of the present invention.
Figure 2:
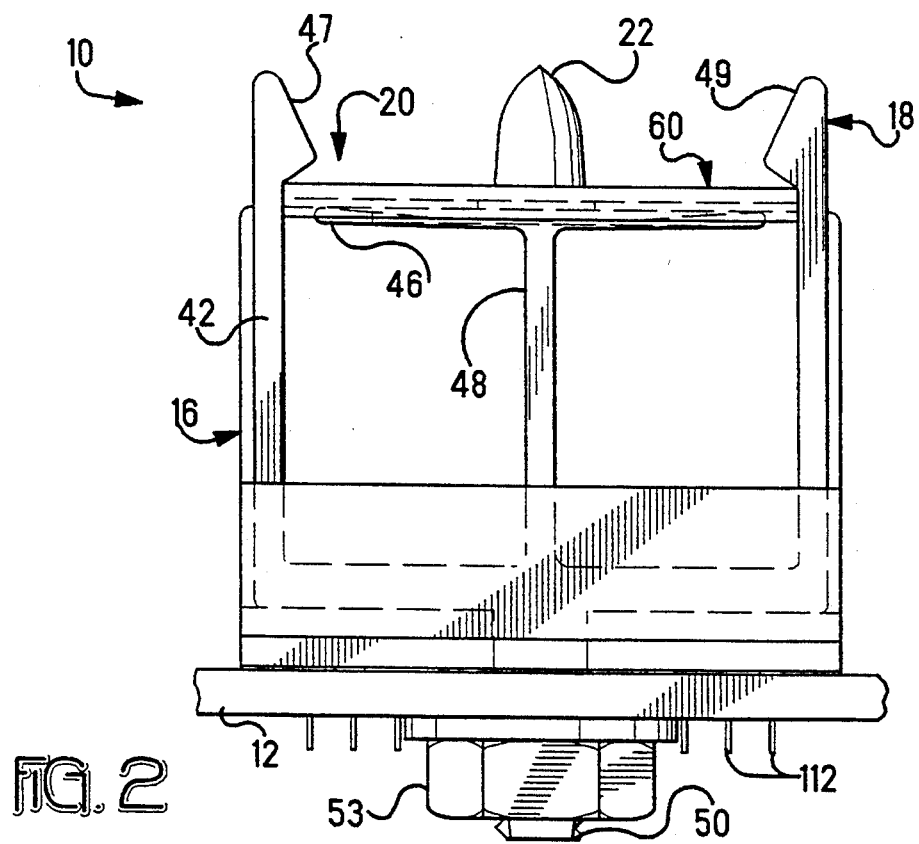
FIG. 2 is an end view of the socket shown in FIG. 1.
Figure 5:
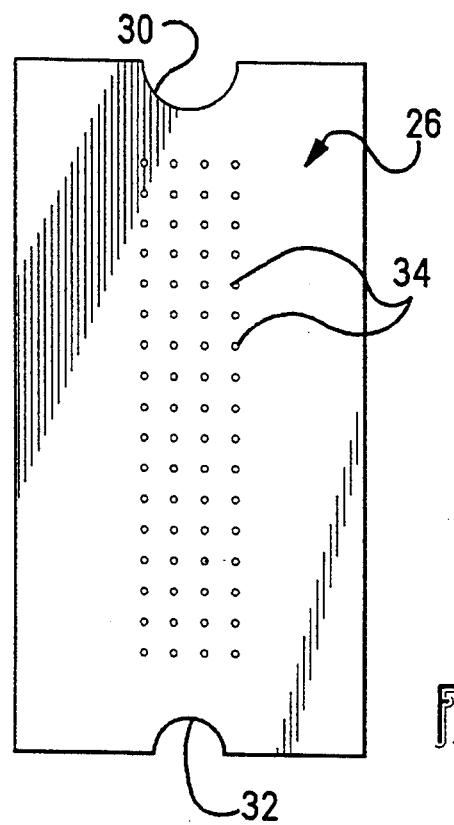
FIG. 5 is a plan view of the guide plate shown in FIG. 4.

There is shown in FIGS. 1, 2, and 3 a socket 10 attached to a printed circuit board 12 having circuitry thereon for testing an integrated circuit chip 14. The connector includes a housing 16, a pair of latching members 18, and a chip carrier 20 held in place by the latching members. The latching members 18 slide into a groove 19 formed in each end of the housing 16. A pair of guide pins 22 and 24, projecting upwardly from the housing, accurately align the chip carrier with the socket as will be described below. An electrically insulating guide plate 26 is arranged in a cavity 28 in the housing, as best seen in FIGS. 4 and 5. The guide plate 26, in the present example, is made of ceramic for its superior wear, however, it could be made of a suitable plastic or other insulating material. The guide plate 26 has a half round opening 30 in one end thereof that conforms very closely with the diameter of the guide pin 22 and another half round opening 32 in the other end that very closely conforms with the diameter of the guide pin 24. The spacing of the two half round openings is such that there is a slight interference with the pins when the guide plate 26 is inserted into the cavity 28. This assures that the ceramic guide plate is accurately positioned with respect to the guide pins 22 and 24. A series of openings 34 are formed through the guide plate 26 in a pattern that is spaced similar to the spacing of the bond pads on the chip 14. These openings 34 are very accurately positioned with respect to the half round openings 30 and 32 for a purpose that will be explained below.

Figure 6:
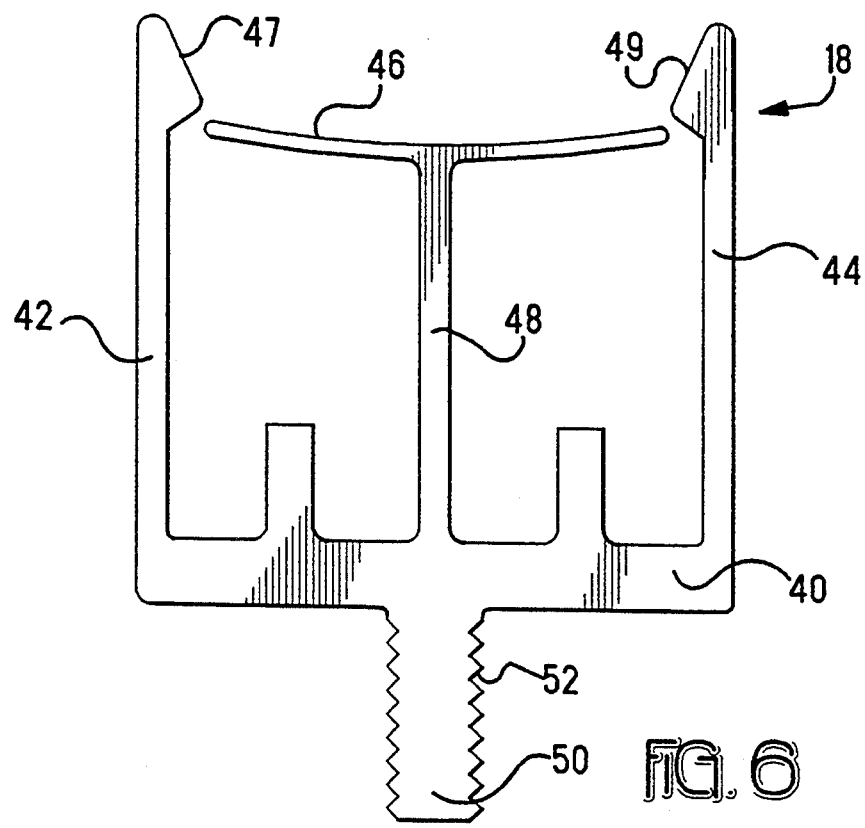
FIG. 6 is a plan view of the latching member shown in FIG. 2.
Figure 9:
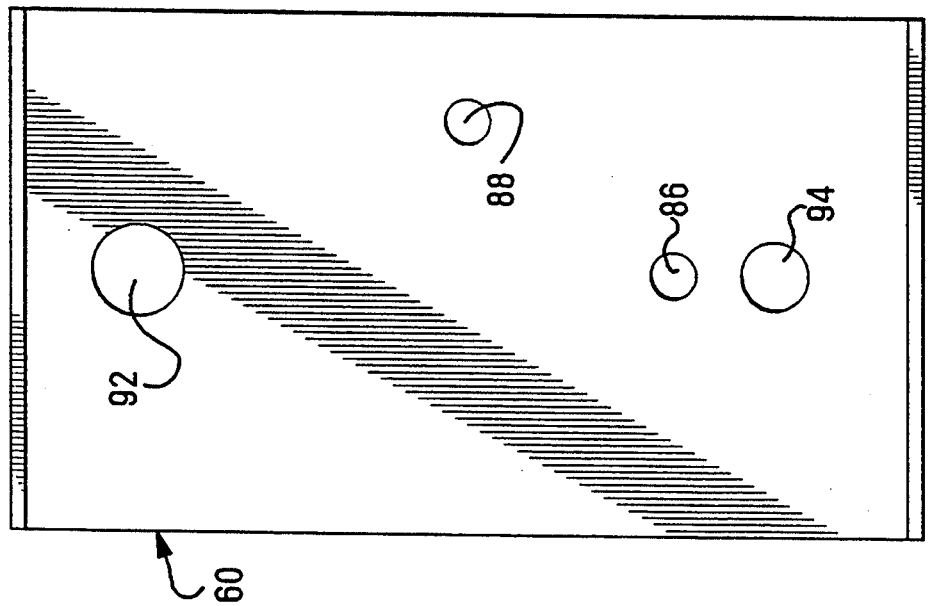
FIG. 9 is a plan view of the carrier plate of the chip holder.
Figure 8:
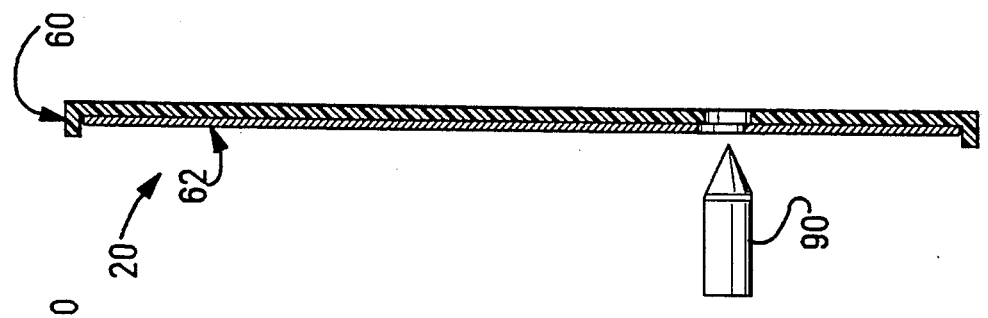
FIG. 8 is a cross-sectional view of the chip holder taken along the lines 8—8 shown in FIG. 7.
Figure 7:
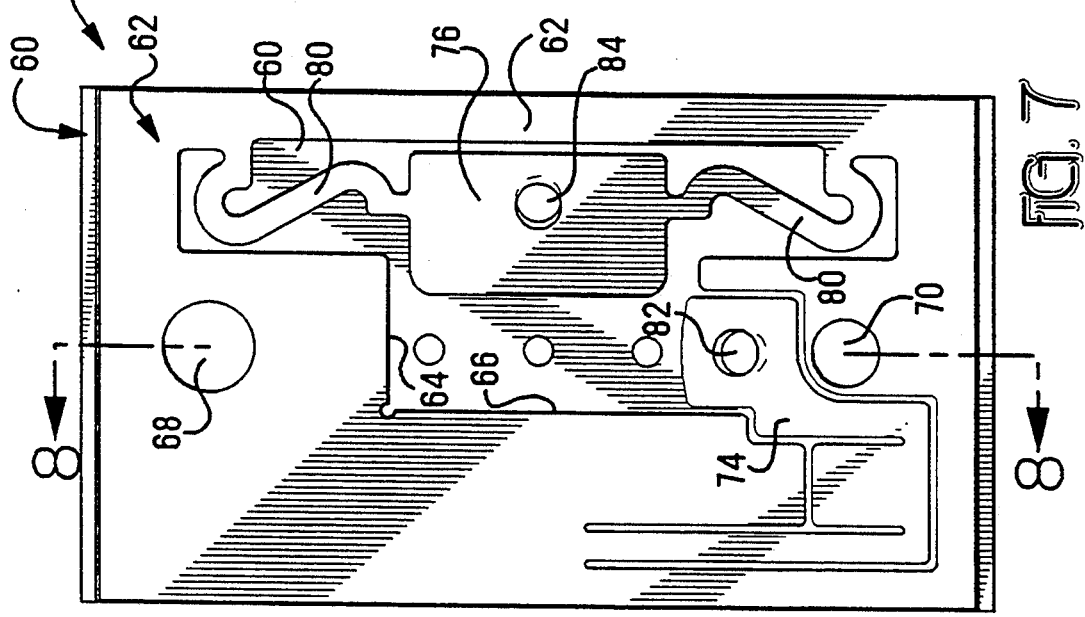
FIG. 7 is a plan view of the chip holder of the present invention.
Figure 10:
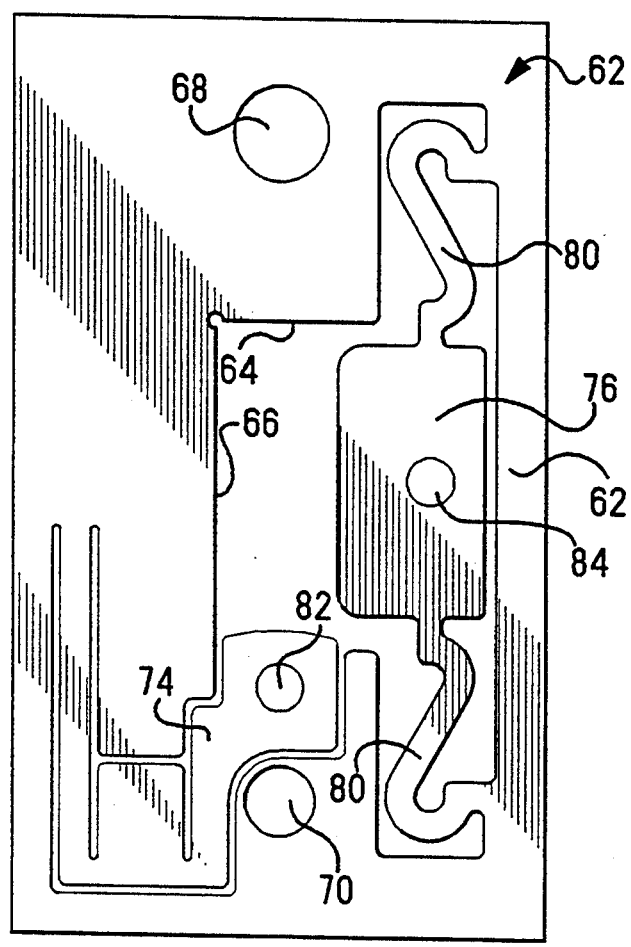
FIG. 10 is a plan view of the retainer of the chip holder.

The latch members 18, as best seen in FIG. 6, include a base 40, two spaced cantilevered arms 42 and 44, and a resilient member 46 which serves as an ejection mechanism to eject the chip holder 20. The resilient member 46 is a center supported beam cantilevered outwardly in opposite directions so that its free ends are adjacent the ends of the two arms 42 and 44. The center support 48 extends, parallel to the arms, from the center of the base 40 to the center of the resilient member 46. The end of each arm 42, 44 has a camming surface 47, 49 respectively thereon facing inwardly so that the two camming surfaces are mutually opposing and vertically above the tips of the resilient member 46, as shown in FIG. 6, for a purpose that will be discussed below. As is shown, the tips of the resilient member 46 are bowed upwardly from the center support 48 so that they can be elastically deflected well below the camming surfaces. A shank 50 extends from the base 40 in a direction opposite that of the arms 42 and 44 and includes screw threads 52 in its edges for receiving a mating nut thereon. When the latching members 18 are inserted into the grooves 19 of the housing 16 and their extensions 50 inserted through holes in the circuit 12, nuts 53 are tightly threaded onto the extensions thereby securing the housing 16 and latching members 18 to the board 12. The latching member 18, including the arms 42, 44, the resilient member 46 and its support 48, the base 40, and the threaded extension 52 is of unitary construction, being made from a single piece of spring material, such as for example beryllium copper or stainless steel.

There is shown in FIGS. 7 through 10 the chip carrier 20 consisting of a carrier plate 60 and a retainer plate 62. The retainer plate 62 includes first and second mutually normal banking surfaces 64 and 66 and first and second holes 68 and 70 that are sized and spaced to slip over the pins 22 and 24 when the guide plate 26 is in place, as shown in FIG. 3, without appreciable play or lateral movement. Since there is essentially no play between the retainer plate and the pins and the guide plate and the pins, the banking surfaces 64 and 66 can be positioned very accurately with respect to the openings 34. Therefore, when a chip 14 is placed with two of its edges against the banking surfaces 64 and 66, the bond pads on the surface of the chip can be accurately aligned with the openings 34. An engagement means is provided to urge the chip against these two surfaces to locate and clamp the chip in place. The engagement means consists of a first abutting member 74 opposite the first banking surface 64 and a second abutting member 76 opposite the second banking surface 66. Spring members 78 and 80 urge the abutting members 74 and 76 toward their respective banking surfaces 64 and 66. The retainer, first and second abutting members, and the spring members are of unitary construction and formed from a relatively thin flat plate of spring material. The first abutting member 74 has a first opening 82 therethrough and the second abutting member 76 has a second opening 84 therethrough. The carrier plate has corresponding openings 86 and 88 that are misaligned with their respective first and second openings 82 and 84 so that when a tapered pin 90 is inserted through each opening in the retainer plate 62 it cams against an edge of the corresponding opening in the carrier plate 60 thereby moving the first and second abutting members away from the first and second banking surface and out of locating clamping engagement with the chip 14. When the two tapered pins 90 are removed from the first and second openings the first and second abutting members move toward the first and second banking surfaces and into locating clamping engagement with the chip 14. The retainer plate 62 is attached to the carrier plate 60 by any suitable means such as spot welding. Additionally, a pair of holes 92 and 94 are formed in the carriage plate 60 in alignment with the openings 68 and 70 and provide clearance for the guide pins 22 and 24.

A series of contacts 100 are positioned within an insulating holder consisting of a right part 102 and a left part 104, as viewed in FIG. 11. Each of the contacts 100 consists of a shank 106 contained within the insulating holder, a contact tip 108 for electrically contacting a bond pad of the chip 14, a resilient portion 110 between the tip and the shank which elastically urges the tip into the position shown in FIG. 11, and a tail 112 for electrically connecting to circuitry contained on the circuit board 12. The contacts are arranged in the holder 102, 104 so that the tails 112 conform to the pattern of the circuitry on the board 12 and are in alignment with plated through holes therein. While, in the present example, the holder is composed of right and left hand parts 102 and 104, a one piece holder may work well, provided that there is sufficient room to provide the resilient portion 110 of the contact 100. In any case, the holder is arranged in a cavity in the housing 16 adjacent the circuit board 12, as shown in FIGS. 11 and 12. A plastic lead organizer 114 is provided to maintain the tails in alignment prior to assembling to the circuit board 12. As is shown in FIGS. 11 and 12, the contacts 100, after exiting the top of the holder, bend toward the center of the Socket 10 at about a 45 degree angle and then bend upwardly parallel with their shanks and extend through their respective openings 34 in the ceramic guide plate 26. The connector tips 108 extend above the guide plate 26 a sufficient amount so that when the chip holder 20 is secured in place by the latching members 18, each of the tips 108 electrically engages a respective bond pad on the chip 14. As such engagement is effected, the tips 108 are caused to move downwardly toward the guide plate 26 a slight amount as the chip holder 20 is inserted into the socket 10 and latched into place by the latching members 18. This slight downward movement is accommodated by the resilient portion 110 which also provides the necessary contact force to achieve a good electrical connection between the tips 108 and the bond pads of the chip. It will be understood that angles other than the 45 degree angle of the resilient portion 110 may be utilized provided that a sufficient amount of elastic deflection and contact force are realized.

During insertion of the chip holder 20 into the socket 10, the upwardly bowed tips of the beam 46 are engaged by the lower surface of the chip holder and deflected downwardly until the holder is latched into position by the arms 42 and 44. When it is desired to remove the chip holder a tool, not shown, having a pair of spaced edges is moved toward the socket 10 until the edges engage the camming surfaces 47 and 49 of the latching members 18 causing the arms 42 and 44 to separate thereby releasing the chip holder 20. The chip holder is then ejected by the beam 46 returning to its rest position shown in FIG. 11.

Figure 13:
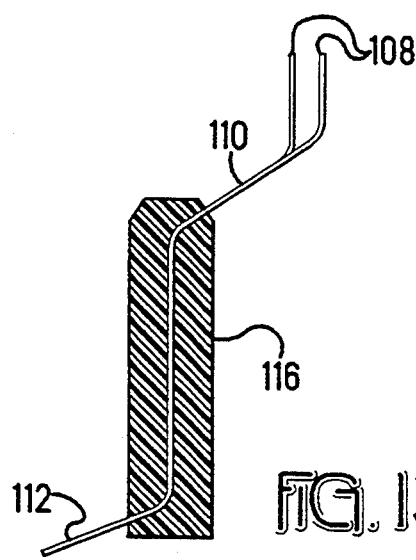
FIG. 13 is a partial cross-sectional view of an alternative structure for the contact holder shown in FIG. 11.

There is shown in FIG. 13 a contact holder part 116, which is an alternative to the contact holder parts 102 and 104, where the tails 112 are arranged for surface mounting to the circuit board 12. It will be appreciated that similar variations in the structure of the contacts and the contact holder may be made in the practice of the present invention.

An important advantage of the present invention is that the socket will directly connect to the bond pads of the chip for burn-in and other testing, and that later can be easily and safely removed. The chip is held in a holder that is compatible with both the socket 10 and with standard automation equipment that may be utilized in subsequent manufacturing processes. Additionally, the socket and chip holder are economical to manufacture and easy to use.

We claim:

1. A socket for electrically connecting to and disconnecting from the bond pads of an integrated circuit chip, said bond pads being spaced in a specific pattern, said socket comprising:
   (a) a chip holder for holding said chip in a desired position;
   (b) a housing;
   (c) contact members in said housing, one end of each said contact member having a contact tip adapted for electrically contacting a respective bond pad of said chip;

(d) a guide plate associated with said housing for positioning said contact tips to correspond with said specific pattern of said bond pads;

(e) means for aligning said guide plate and said chip holder so that said contact tips are in registry with said bond pads; and (f) a latching member for releasably securing said chip holder to said housing so that each said contact tip electrically contacts its respective said bond pad, said latching member includes a pair of opposed resilient arms having inwardly facing camming surfaces thereon arranged to engage opposite sides of said chip holder so that as said holder is urged toward said secured engagement therewith said arms are cammed apart until said holder passes said camming surfaces and then said arms elastically move toward each other thereby latching said chip holder in said secured engagement with said housing.

2. The socket according to claim 1 wherein the other end of each of said contact members is adapted to be electrically connected to circuitry of a component for electrically connecting said bond pads to said circuitry.

3. The socket according to claim 1 wherein said guide plate has openings through which said contact tips project, wherein said openings are spaced in correspondence with said specific pattern.

4. The socket according to claim 3 wherein each of said contact members includes a shank adjacent said other end and a resilient portion between said shank and said contact tip so that when said chip holder is secured to said housing said resilient portion urges said contact tip into said electrical contact with its respective said bond pad.

5. The socket according to claim 4 including an insulating contact holder for positioning said contact members within said housing so that said contact tips are substantially in alignment with said openings in said guide plate.

6. The socket according to claim 5 wherein said holder comprises two holder parts, one of which positions some of said contact members on one side of said housing and the other of which positions some of the remaining contact members on the other side of said housing.

7. The socket according to claim 6 wherein said housing includes two spaced apart cavities arranged to receive said two holder parts, 8. The socket according to claim 1 wherein said latching member includes a resilient member arranged to urge said chip holder to a position out of said secured engagement.

9. The socket according to claim 8 wherein said resilient member is further arranged to eject said chip holder when said camming surfaces of said two arms are urged apart.

10. The socket according to claim 8 wherein said latching member including said pair of arms and said resilient member are of unitary construction and formed from a relatively thin flat plate of spring material.

11. The socket according to claim 10 wherein said resilient member comprises a center supported beam cantilevered outwardly in opposite directions so that its free ends are adjacent said camming surfaces of said arms.

12. The socket according to claim 11 wherein said latching member includes a threaded extension adapted to receive a nut thereon projecting in a direction opposite said resilient member and wherein said socket includes two said latching members, said housing having an opening at each end thereof for receiving said two latching members so that when said threaded extensions are inserted through openings in a substrate and nuts threaded thereon said socket is secured to said substrate.

13. The socket according to claim 12 wherein said other ends of said contact members are arranged to electrically contact circuitry on said substrate when said socket is secured thereto.

14. The socket according to claim 1 wherein said means for aligning said guide plate and said chip holder comprises a pair of spaced locating pins projecting from said housing above said guide plate which closely engage two features in said guide plate, one feature in each of two opposite edges, said two features being accurately positioned with respect to said openings in said guide plate, and two openings in said chip holder identically spaced with said two pins and sized to closely engage said pins.

15. The socket according to claim 14 wherein said chip holder includes a pair of banking surfaces accurately positioned with respect to said two locating pins, so that when two edges of said chip are urged against said two banking surfaces and said chip holder is secured to said housing, said bond pads of said chip are in alignment and electrical contact with said contact tips of said contact members.

16. The combination of a circuit board having circuitry thereon for testing an integrated circuit chip and a socket for electrically connecting said circuitry to and disconnecting it from the bond pads of an integrated circuit chip, said bond pads being spaced in a specific pattern, said socket comprising:

(a) a chip holder for holding said chip in a desired position;

(b) a housing;

(c) contact members in said housing, one end of each said contact member having a contact tip electrically contacting a respective bond pad of said chip and the other end thereof electrically contacting said testing circuitry on said circuit board;

(d) a guide plate associated with said housing for positioning said contact tips to correspond with said specific pattern of said bond pads;

(e) means for aligning said guide plate and said chip holder so that said contact tips are in registry with said bond pads; and (f) a latching member for releasably securing said chip holder to said housing so that each said contact tip electrically contacts its respective said bond pad, said latching member includes a pair of opposed resilient arms having inwardly facing camming surfaces thereon arranged to engage opposite sides of said chip holder so that as said holder is urged toward said secured engagement therewith said arms are cammed apart until said holder passes said camming surfaces and then said arms elastically move toward each other thereby latching said chip holder in said secured engagement with said housing.

17. The socket according to claim 16 wherein said guide plate has openings through which said contact tips project, wherein said openings are spaced in correspondence with said specific pattern.

18. The socket according to claim 16 wherein said latching member including said pair of arms and said resilient member are of unitary construction and formed from a relatively thin flat plate of spring material.

19. The socket according to claim 18 wherein said resilient member comprises a center supported beam cantilevered outwardly in opposite directions so that its free ends are adjacent said camming surfaces of said arms.

20. The socket according to claim 19 wherein said latching member includes a threaded extension projecting in a direction opposite said resilient member and wherein said socket-includes two said latching members, said housing having an opening at each end thereof for receiving said two latching members, wherein said threaded extensions extend through openings in a substrate and nuts are threaded thereon thereby securing said socket to said substrate.

* * * * *